United States Patent
Vincent et al.

(10) Patent No.: US 9,377,492 B2
(45) Date of Patent: Jun. 28, 2016

(54) DEVICE FOR ESTIMATING THE IMPEDANCE OF AN ELECTRIC EARTH CONNECTION, ASSOCIATED ESTIMATION METHOD AND ELECTRIC POWER SUPPLY SYSTEM

(71) Applicant: SCHNEIDER ELECTRIC INDUSTRIES SAS, Rueil-Malmaison (FR)

(72) Inventors: Francois Vincent, Le Cheylas (FR); Simon Tian, Eybens (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 156 days.

(21) Appl. No.: 14/311,687

(22) Filed: Jun. 23, 2014

(65) Prior Publication Data

US 2015/0002163 A1 Jan. 1, 2015

(30) Foreign Application Priority Data

Jun. 26, 2013 (FR) ...................................... 13 56155

(51) Int. Cl.
  *G01R 31/02* (2006.01)
  *G01R 27/20* (2006.01)

(52) U.S. Cl.
  CPC ...................................... *G01R 27/20* (2013.01)

(58) Field of Classification Search
  CPC ........ G01R 31/02; G01R 31/08; G01R 27/16; G01R 1/20
  USPC .......................................... 324/606, 126, 525
  See application file for complete search history.

(56) References Cited

U.S. PATENT DOCUMENTS

| 2006/0226850 A1* | 10/2006 | Stitt ..................... G01R 27/205 324/525 |
| 2009/0147415 A1* | 6/2009 | Lazarovich .............. H02H 9/08 361/42 |
| 2012/0319660 A1* | 12/2012 | Hagenmaier, Jr. ... G02R 27/025 320/162 |

FOREIGN PATENT DOCUMENTS

| EP | 2 551 981 A1 | 1/2013 |
| JP | 2009-210438 | 9/2009 |
| JP | 2009-238573 | 10/2009 |
| JP | 2010-205570 | 9/2010 |

OTHER PUBLICATIONS

French Preliminary Search Report issued Mar. 19, 2014, in French Application No. 13 56155 filed Jun. 26, 2013 (with English Translation of Categories of Cited Documents).

* cited by examiner

*Primary Examiner* — Tung X Nguyen
*Assistant Examiner* — Zannatul Ferdous
(74) *Attorney, Agent, or Firm* — Oblon, McClelland, Maier & Neustadt, L.L.P.

(57) ABSTRACT

The device according to the invention for estimating the impedance of an ground connection, the ground connection being connected to the ground of an alternating electric network (14) comprising a phase connected to an electric phase conductor and a neutral connected to an electric neutral conductor, comprises:
  an electrical component having a predetermined value impedance positioned between the phase conductor and the ground connection;
  a first sensor capable of measuring a first value of a first property between the phase conductor and the ground connection and a second value of the first property;
  a second sensor capable of measuring a first value of a second property between the neutral conductor and the ground connection and a second value of the second property; and
  a computation member computing the impedance of the ground connection.

10 Claims, 3 Drawing Sheets

DEVICE FOR ESTIMATING THE IMPEDANCE OF AN ELECTRIC EARTH CONNECTION, ASSOCIATED ESTIMATION METHOD AND ELECTRIC POWER SUPPLY SYSTEM

The present invention relates to a device for estimating the impedance of an electric ground connection, the ground connection being connected to the ground of an alternating electric network, the alternating electric network comprising a phase connected to an electric phase conductor and a neutral connected to an electric neutral conductor, the device being intended to be connected to the phase conductor, the neutral conductor and the ground connection.

The invention also relates to an electric power supply system, the system being connected to an alternating electrical grid comprising a phase connected to the electric phase conductor, a neutral connected to an electric neutral conductor and a ground connected to an electric ground connection.

The invention also relates to a method for estimating the impedance of an electric ground connection.

Known from document EP 2,551,981 A1 is a device for estimating the impedance of an ground conductor. The device comprises a voltage generator and a current sensor connected in series between the phase conductor and the ground conductor. The impedance of the ground conductor is calculated from the value of the voltage imposed by the generator, and the value of the current circulating through the ground conductor and the phase conductor, measured by the current sensor.

However, such a device does not make it possible to estimate the impedance of the ground conductor of several electrical installations of a same electrical grid, generating significant additional leakage currents, which prevent a precise measurement of the impedance of the ground conductor. In fact, when this type of device is connected to several electrical installations of a same grid, it generates significant additional leakage currents, which prevent a precise measurement of the impedance of the ground conductor.

One aim of the invention is therefore to propose a device for estimating the impedance of an electric ground connection that can be installed on several electrical installations connected to a same electrical grid.

To that end, the invention relates to a device for estimating an electric ground connection of the aforementioned type, characterized in that it comprises:
an electrical component having an impedance with a predetermined value, the electrical component being positioned between the phase conductor and the ground connection;
a switch capable of electrically isolating the electrical component of the phase conductor in an open state, and electrically connecting the electrical component to the phase conductor in a closed state;
a first sensor capable of measuring a first value of a first electrical property between the phase conductor and the ground connection when the switch is in the open state, and a second value of the first electrical property when the switch is in the closed state;
a second sensor capable of measuring a first value of a second electrical property between the neutral conductor and the ground connection when the switch is in the open state, and a second value of the second electrical property when the switch is in the closed state; and
a computation member capable of computing the impedance of the ground connection from the predetermined value of the impedance of the electrical component and values of the first and second measured electrical properties.

According to other advantageous aspects of the invention, the estimating device comprises one or more of the following features, considered alone or according to any technically possible combination(s):
the first and second electrical properties are electrical voltages;
the estimating device comprises means for detecting the phase conductor from among the phase conductor and neutral conductor;
the detection means comprise:
a relay capable of electrically connecting the phase conductor to the electrical component in a first position, and electrically connecting the neutral conductor to the electrical component in a second position; and
measuring means capable of measuring the electrical voltage between the phase conductor and the ground connection, and measuring the electrical voltage between the neutral conductor and the ground connection.

The invention also relates to an electric power supply system for an electrical installation, the system being connected to an alternating electrical grid, the alternating grid comprising a phase connected to an electric phase conductor, a neutral connected to an electric neutral conductor, and ground connected to an electric ground connection, the system being characterized in that it comprises a device for estimating the impedance of the ground connection as described above.

According to other advantageous aspects of the invention, the electric power supply system comprises one or more of the following features, considered alone or according to any technically possible combination(s):
the electric power supply system comprises a cutoff member connected to the phase conductor and to the neutral conductor between the estimating device and the electrical installation, the cutoff member being movable between an open position, in which the electrical installation is isolated from the electrical grid, and a closed position, in which the electrical installation is connected to the electrical grid by means of phase and neutral conductors, the cutoff member being capable of being commanded in the open position when the computed impedance of the ground connection is above a threshold value; and
the threshold value of the impedance of the ground connection is comprised between 10 ohms and 500 ohms, and in particular substantially equal to 100 ohms.

The invention also relates to a method for estimating the impedance of an electric ground connection, the electric ground connection being connected to the ground of an alternating electrical grid comprising a phase connected to an electric phase conductor and a neutral connected to an electric neutral conductor, the phase conductor, the neutral conductor and the ground connection being connected to a device for estimating the impedance of the ground connection as described above, the method comprising the following steps:
positioning the switch in the open state;
measuring the first value of the first electrical property using the first sensor and measuring the first value of the second electrical property using the second sensor, when the switch is in the open state;
positioning the switch in the closed state;
measuring the second value of the first electrical property using the first sensor and measuring the second value of the second electrical property using the second sensor, when the switch is in the closed state; and computing the impedance of the ground connection from the predetermined value of the impedance of the electrical component and the values of the first and second measured electrical properties.

According to other advantageous aspects of the invention, the method for estimating the impedance of an electric ground connection comprises one or more of the following features, considered alone or according to any technically possible combination(s):

the method comprises a step for commanding the opening of the phase conductor and the neutral conductor when the computed impedance of the ground connection is above a threshold value, the command step being carried out using a cutoff member connected to the phase conductor and to the neutral conductor between the estimating device and the electrical installation, the cutoff member being movable between an open position, in which the electrical installation is isolated from the electrical grid, and an open position, in which the electrical installation is connected to the electrical grid by means of phase and neutral conductors, the cutoff member being commanded in the open position when the computed impedance of the ground connection is above the threshold value; and the method comprises a step for detecting the phase conductor from among the phase conductor and the neutral conductor, and a step for electrically connecting the electrical component to the phase conductor.

These features and advantages of the invention will appear upon reading the following description, provided solely as a non-limiting example, and done in reference to the appended drawings, in which.

Figure 1:
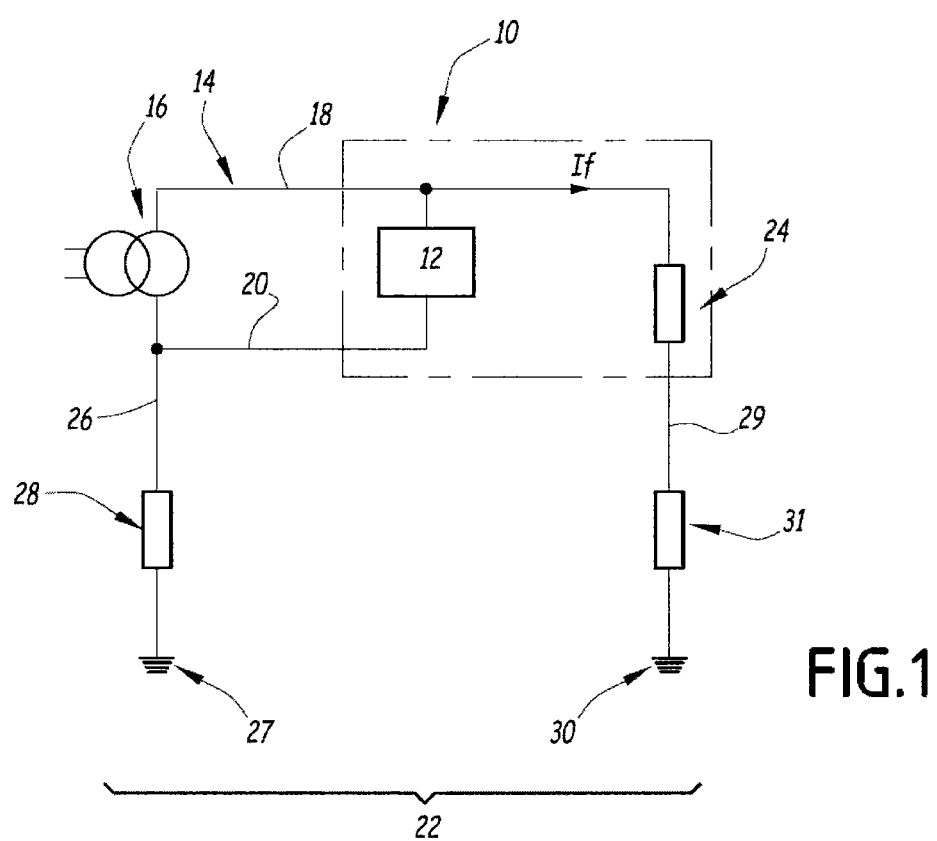
FIG. 1 is a diagrammatic model of an electrical installation connected to an electric power distribution grid.

In FIG. 1, an electric power supply system 10 comprising an electrical installation 12 is connected to an alternating electrical grid 14. The electrical grid 14 is powered by an electric transformer 16. The electrical grid 14 comprises an electric phase conductor 18 connected to the phase of the transformer 16, an electric neutral conductor 20 connected to the neutral of the transformer 16, and an electric ground connection 22 connected to the ground.

The power supply system 10 is capable of supplying electricity to the electrical installation 12. When the electrical installation 12 is connected to the grid 14, a leakage current If toward the ground may appear. FIG. 1 shows the leakage impedance 24 through which the leakage current If flows. The leakage impedance 24 has a value Zf.

The electrical installation 12 is, for example, a battery charger for an electric vehicle, connected to the electrical grid 14 by means of a charging terminal (not shown).

Alternatively, the electrical installation 12 is a building, for example a residence, connected to the electricity grid 14.

The electricity grid 14 is, for example, a single-phase alternating grid, comprising a phase and a neutral. Alternatively, the electrical grid 14 is a three-phase electrical grid.

The electrical transformer 16 forms a voltage source for the power supply system 10. The electrical transformer 16 is connected to the ground by means of a first ground conductor 26 and a first ground electrode 27. The first ground conductor 26 and the first ground electrode 27 have a first ground impedance 28 with the value Za.

The electrical transformer 16 is connected to the electrical installation 12 by means of the phase conductor 18 and the neutral conductor 20. The frame of the electrical installation 12 is connected to the ground by means of a second ground conductor 29 and a second ground electrode 30. The second ground conductor 29 and the second ground electrode 30 have a second ground impedance 31 with a value Zb.

Thus, in the described example embodiment, the electric ground connection 22 is formed by the first ground conductor 26 and the first ground electrode 27 connecting the electrical transformer 16 to the ground, and by the second ground conductor 29 and the second ground electrode 30 connecting the frame of the electrical installation 12 to the ground. The ground connection 22 has an impedance with a value Zt equal to the sum of the values Za, Zb of the first and second impedances 28, 31.

Figure 2:
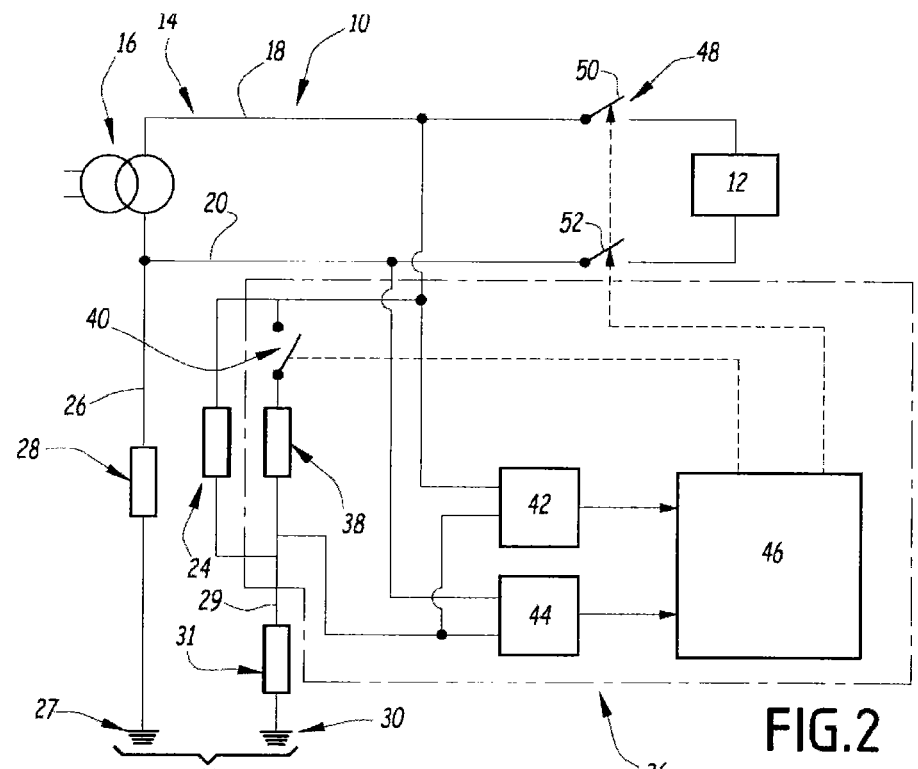
FIG. 2 is a diagrammatic illustration of an estimating device according to the invention, connected to the power supply system according to the invention.
Figure 3:
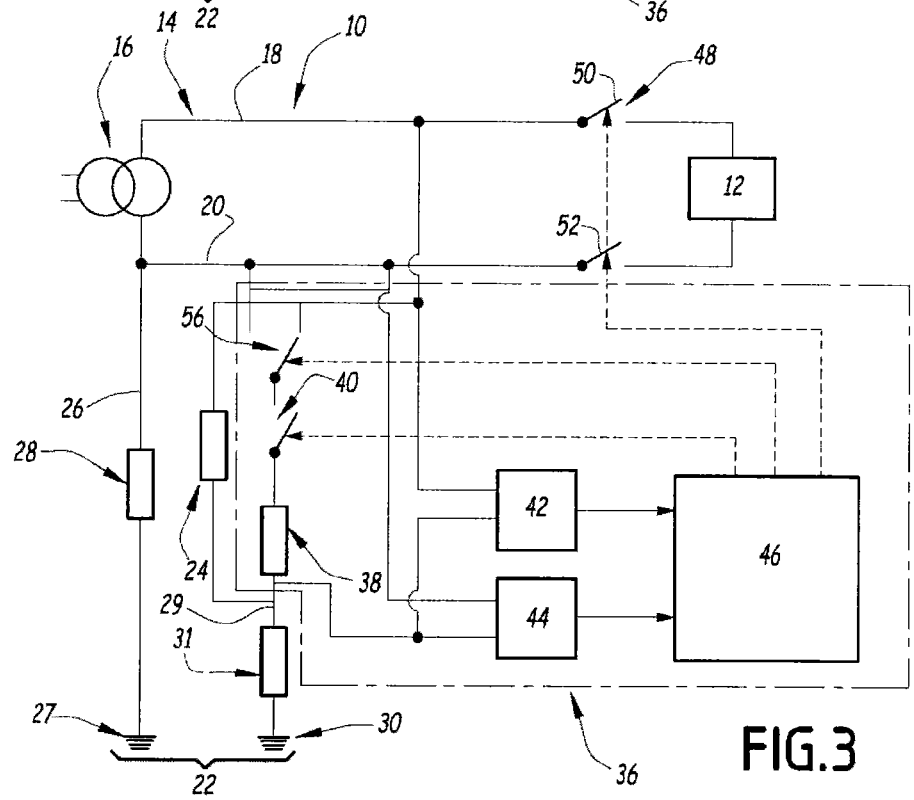
FIG. 3 is a view similar to that of FIG. 2, according to one alternative embodiment of the invention.

According to FIGS. 1 to 3, the power supply system 10 is connected to the ground according to the "TT" load. More specifically, the neutral of the transformer 16 and the frame of the electrical installation 12 are each connected to the ground by means of first and second distinct ground electrodes 27, 30.

Other types of connection of the power supply system 10 to the ground are possible.

According to the "TN" load (not shown), the frame of the electrical installation 12 has no local ground and is connected to the neutral conductor. The neutral conductor is connected to the local ground of the transformer.

According to the "IT" load (not shown), the neutral of the electric transformer 16 is electrically insulated relative to the ground, and the frame of the electrical installation 12 is connected to the ground using a local ground electrode.

As shown in FIGS. 2 and 3, the power supply system 10 further comprises an estimating device 36 for estimating the value Zt of the impedance of the ground connection 22. The estimating device 36 is shown in dotted lines in FIGS. 2 and 3.

According to FIGS. 2 and 3, the estimating device 36 comprises an electrical component 38 connected to the second ground conductor 29 and capable of being connected to the phase conductor 18. The estimating device 36 further comprises a switch 40 capable of isolating or electrically connecting the electrical component 38 to the phase conductor 18.

The estimating device 36 is capable of estimating the value Zt of the ground connection 22, i.e., it is capable of estimating the sum of the values Za, Zb of the first and second impedances 28, 31.

The estimating device 36 is connected to the phase conductor 18, the neutral conductor 20 and the second ground conductor 29.

The electrical component 38 has an impedance with a predetermined value Zc. The electrical component 38 is for example a component having a resistive impedance, such as a resistance.

The switch 40 is connected in series with the electrical component 38 between the phase conductor 18 and the second ground impedance 31 of the second ground conductor 29.

The switch 40 is for example a bistable electromechanical relay. Alternatively, the switch 40 is an electronic switch.

The switch 40 is movable between an open state and a closed state. In the open state, the switch 40 electrically isolates the electrical component 38 from the phase conductor 18. In the closed state, the switch 40 electrically connects the electrical component 38 to the phase conductor 18.

As shown in FIGS. 2 and 3, the estimating device 36 further comprises a first sensor 42, a second sensor 44, and a computation member 46.

The first sensor 42 is capable of measuring a first value $Vpt_0$ of a first electrical property Vpt, for example a voltage, between the phase conductor 18 and the second ground conductor 29 when the switch 40 is in the open state, and a second value $Vpt_1$ of the first electrical property Vpt when the switch is in the closed state.

The second sensor 44 is capable of measuring a first value $Vnt_0$ of a second electrical property Vnt, for example an electric voltage, between the neutral conductor 20 and the second ground conductor 29 when the switch 40 is in the open state, and a second value $Vnt_1$ of the second electrical property Vnt when the switch 40 is in the closed state.

As will be described below, the computation member 46 is capable of computing the value Zt of the impedance of the ground connection 22 from the predetermined value Zc of the impedance of the electrical component 38 and values $Vpt_0$, $Vpt_1$, $Vnt_0$, $Vnt_1$ of the voltages measured by the first and second sensors 42, 44 in the open and closed states of the switch 40.

The computation member 46 is for example formed by a microprocessor.

The power supply system 10 further comprises a cutoff member 48.

The cutoff member 48 is electrically connected to the phase conductor 18 and the neutral conductor 20 between the electric transformer 16 and electrical installation 12.

The cutoff member 48 is for example formed by a first switch 50 positioned on the phase conductor 18 between the transformer 16 and the electrical installation 12, and by a second switch 52 positioned on the neutral conductor 20 between the transformer 16 and the electrical installation 12.

The first and second switches 50, 52 are movable between an open position, in which the electrical installation 12 is electrically isolated from the transformer 16, and a closed position, in which the electrical installation 12 is electrically connected to the transformer 16 by means of the phase 18 and neutral 20 conductors.

When the value Zt of the computed ground impedance is below a threshold value $Zt_{seuil}$, the power supply system 10 is authorized to operate, and the electrical installation 12 is powered on. The first and second switches 50, 52 are then in the closed position.

When the value Zt of the computed impedance of the ground connection 22 is above a threshold value $Zt_{seuil}$, the operation of the power supply system 10 varies depending on the nature of the electrical installation 12 to which the estimating device 36 is connected.

If the electrical installation 12 is, for example, a charging terminal for an electric vehicle, the first and second switches 50, 52 are switched to the open position by the computation member 46, such that the charging terminal is no longer receiving power.

If the electrical installation 12 is a building, for example, such as a residence, a security alarm is emitted.

The threshold value $Zt_{seuil}$ of the impedance of the ground connection 22 is comprised between 10 ohms and 500 ohms, and in particular substantially equal to 100 ohms.

According to an alternative embodiment shown in FIG. 3, the estimating device 36 comprises means 42, 44, 46, 56 for detecting the phase conductor 18 from among the phase conductor 18 and the neutral conductor 20.

The detection means 42, 44, 46, 56 for example comprise a relay 56 with two states, the first and second sensors 42, 44 and the computation member 56.

The relay 56 is movable between two states. In a first state, the relay 56 connects the phase conductor 18 to the relay 40. In the second state, the relay 56 connects the neutral conductor 20 to the relay 40.

Alternatively (not shown), the relay 56 and the switch 40 are formed by a single relay with three states. In a first state, the relay connects the phase conductor 18 to the electrical component 38. In a second state, the relay connects the neutral conductor 20 to the electrical component 38. In a third state, the electrical component 38 is isolated from the phase 18 and neutral 20 conductors.

Alternatively (not shown), the relay 56 and the switch 40 are formed by two relays with two states connected in parallel. In a first state, the two relays respectively connect the phase conductor 18 and the neutral conductor 20 to the electrical component 38. In a second state, the two relays are open and the electrical component 38 is isolated from the phase conductor 18 and the neutral conductor 20.

The first sensor 42 is capable of measuring the electrical voltage between the phase conductor 18 and the second ground conductor 29, and the second sensor 44 is capable of measuring the electrical voltage between the neutral conductor 20 and the second ground conductor 29.

Based on the values of the voltages measured by the first and second sensors 42, 44, the computation member 46 is capable of recognizing the phase conductor from among the two conductors corresponding to the phase conductor 18 and the neutral conductor 20.

Figure 4:
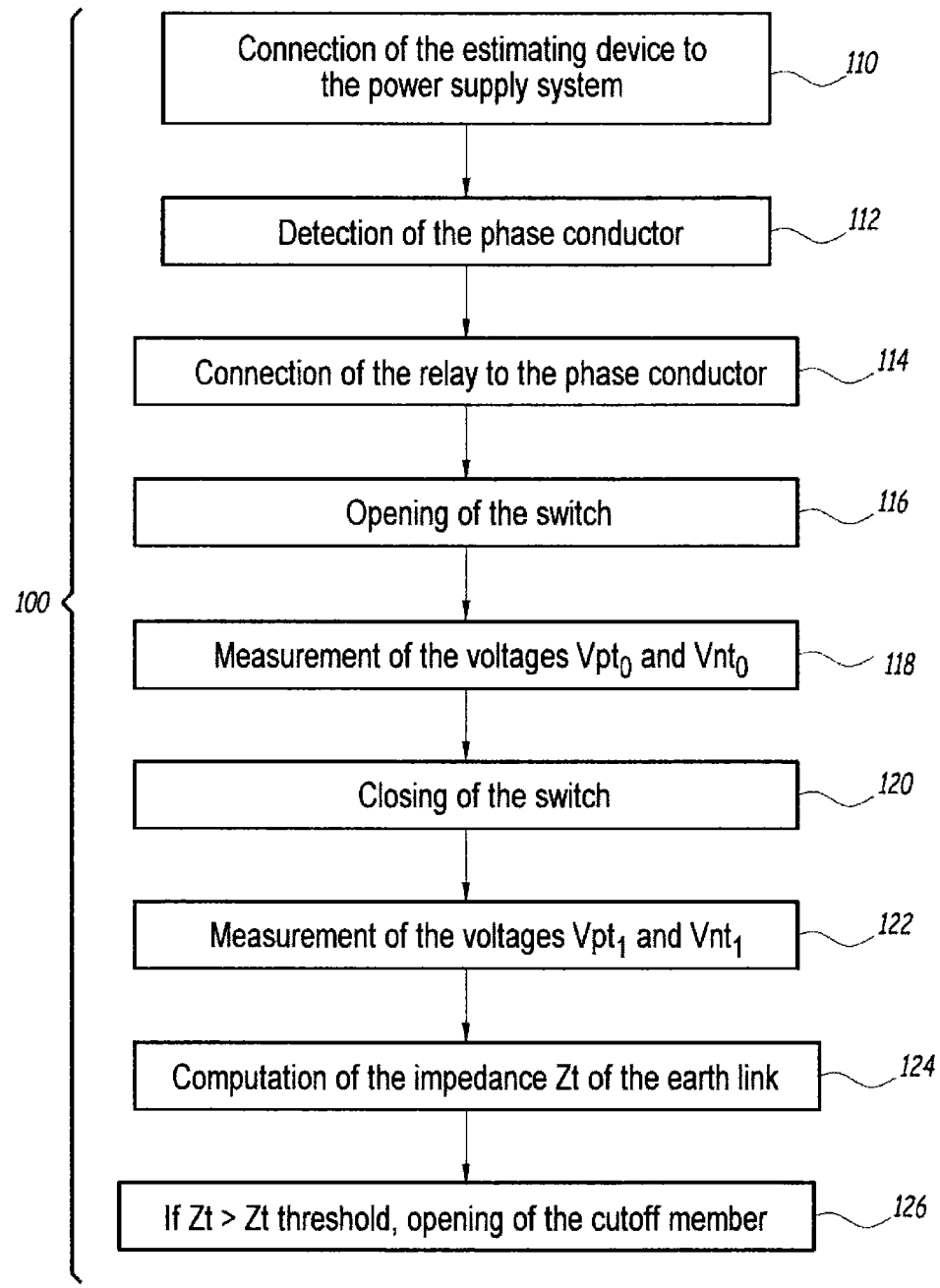
FIG. 4 is a flowchart of a method for estimating the impedance of the electric ground connection.

The operation of the estimating device 36 will now be explained using FIG. 4. FIG. 4 shows a flowchart of the steps of a method 100 for estimating the impedance Zt of the ground connection 22, implemented by the estimating device 36 as described above.

In FIG. 4, during the first step 110, the estimating device 36 according to the invention is connected to the phase conductor 18, the neutral conductor 20 and the second ground conductor 29 of the power supply system 10. The power supply system 10 is connected to the electrical grid 14 by means of the transformer 16 on the one hand, and to another electrical installation 12, for example to a battery charger for an electric vehicle or a building, by means of the phase conductor 18 and the neutral conductor 20, on the other hand. The first and second switches 50 and 52 are in the closed position.

During step 112, the detection means 42, 44, 46, 56 detect the phase conductor 18 from among the two conductors corresponding to the phase conductor 18 and the neutral conductor 20. More specifically, the first sensor 42 for example measures the electrical voltage between the phase conductor 18 and the second ground conductor 29. If the measured voltage is close to 230 V, then it involves the voltage between the phase conductor 18 and the second ground conductor 29, and the phase conductor 18 is then identified. Alternatively, the second sensor 44 measures the electric voltage between the neutral conductor 20 and the second ground conductor 29. If the measured voltage is close to 0 V, then it involves the voltage between the neutral conductor 20 and the second ground conductor 29, and the neutral conductor 20 is then identified.

Once the phase conductor 18 is detected, the relay 56 is positioned in the first state during this step 114, in order to electrically connect the electrical component 38 to the phase conductor 18.

During this step 116, the switch 40 is commanded to be positioned in the open state, i.e., the electrical component 38 is electrically isolated from the phase conductor 18.

Next, during this step 118, the first sensor 42 measures the voltage $Vpt_0$ between the phase conductor 18 and the second ground conductor 29, and the second sensor 44 measures the voltage $Vnt_0$ between the neutral conductor 20 and the second ground conductor 29.

During the following step 120, the switch 40 is commanded to be positioned in the closed state, in which the electrical component 38 is electrically connected to the phase conductor 18.

After step 120, the first sensor 42 measures the voltage $Vpt_1$ between the phase conductor 18 and the second ground conductor 29, and the second sensor 44 measures the voltage $Vnt_1$ between the neutral conductor 20 and the second ground conductor 29, during this step 122.

Next, during step 124, the computation member 46 computes the value Zt of the impedance of the ground connection 22 from the predetermined value Zc of the impedance of the electrical component 38 and the values $Vpt_0, Vnt_0, Vpt_1, Vnt_1$ of the measured voltages.

More specifically, Ohm's law is applied in the power supply system 10 when the switch 40 is in the open state, according to equation (1), and when the switch 40 is in the closed state, according to equation (2):

$$If_0 = \frac{Vtp_0}{Zf} = -\frac{Vtn_0}{Za+Zb} = -\frac{Vtn_0}{Zt} \quad (1)$$

where $If_0$ is the leakage current when the switch 40 is in the open state;

$$If_1 = \frac{Vpt_1}{\frac{1}{Zf}+\frac{1}{Zc}} = -\frac{Vnt_1}{Zt} \quad (2)$$

where $If_1$ is the leakage current when the switch 40 is in the closed state.

Then, from equations (1) and (2), the computation member 46 resolves the following system of two equations in two variables (3):

$$\begin{cases} Zf = Zc*\left[\frac{Vpt_0*Vnt_1}{Vnt_0-Vpt_1}-1\right] \\ Zt = -Zf*\frac{Vnt_0}{Vpt_0} = -Zc*\left[\frac{Vnt_1}{Vpt_1}-\frac{Vnt_0}{Vpt_0}\right] \end{cases} \quad (3)$$

When the value Zt of the computed impedance is above a threshold value $Zt_{seuil}$, for example 100 ohms, the cutoff member 48 is commanded toward its open position during step 126, i.e., the switches 50, 52 are positioned in the open position, so as to cut the power supply to the electrical installation 12, and thereby avoid any risk of electrocution. Alternatively, the electrical installation 12 remains powered by the power supply system 10, but an alarm is emitted. In fact, when the value Zt of the impedance of the ground connection 22 is above that threshold value $Zt_{seuil}$, it means that the frame of the electrical apparatus 12 has an ground connection fault, and is then capable of being at a dangerous electrical potential for users.

One can thus see that the estimating device 36 according to the invention makes it possible not only to estimate the impedance of the ground connection 22, but also to open the connection between the electrical installation 12 and the power supply system 10 when the measured value of the ground connection 22 exceeds a threshold value $Zt_{seuil}$. The estimating device 36 thus makes it possible to avoid any risk of electrocution related to an incorrect connection of the frame of the electrical installation 12 to the ground.

Furthermore, using the electrical component 38 having an impedance with a known value Zc allows the estimating device 36 according to the invention to perform impedance measurements of the ground connection 22 on several electrical installations of the same electrical grid.

In fact, the estimating device 36 according to the invention, unlike the estimating devices of the state of the art with voltage or current injection, does not cause additional leakage currents, and therefore allows precise measurements of the impedance of the ground connection 22 when it is connected to several electrical installations of a same grid.

Such a device and such a method also make it possible, unlike the voltage- or current-injection estimating devices of the state of the art, to estimate the impedance of the ground connection 22 when the electrical installation is connected to the electrical grid according to the IT load.

The estimating device 36 according to the invention is useful not only on charging terminals for electric vehicles, but also in buildings in order to verify the proper connection of electric masses to the ground.

The invention claimed is:

1. A device for estimating an impedance of an electric ground connection, the ground connection being connected to a ground of an alternating electric network, the alternating electric network comprising a phase connected to an electric phase conductor and a neutral connected to an electric neutral conductor, the device being configured to be connected to the phase conductor, the neutral conductor and the ground connection, the device comprising:
   an electrical component having an impedance with a predetermined value, the electrical component being positioned between the phase conductor and the ground connection;
   a switch configured to electrically isolate the electrical component of the phase conductor in an open state, and to electrically connect the electrical component to the phase conductor in a closed state;
   a first sensor configured to measure a first value of a first electrical property between the phase conductor and the ground connection when the switch is in the open state, and a second value of the first electrical property when the switch is in the closed state;
   a second sensor configured to measure a first value of a second electrical property between the neutral conductor and the ground connection when the switch is in the open state, and a second value of the second electrical property when the switch is in the closed state; and
   a computation member configured to compute the impedance of the ground connection from the predetermined value of the impedance of the electrical component and values of the first and second measured electrical properties.

2. The device according to claim 1, wherein the first and second electrical properties are electrical voltages.

3. The device according to claim 1, comprising a detector configured to detect the phase conductor from among the phase conductor and neutral conductor.

4. The device according to claim 3, wherein the detector comprises:
  a relay configured to electrically connect the phase conductor to the electrical component in a first position, and electrically connect the neutral conductor to the electrical component in a second position; and
  a measuring device configured to measure electrical voltage between the phase conductor and the ground connection, and measure electrical voltage between the neutral conductor and the ground connection.

5. An electric power supply system for an electrical installation, the system being connected to an alternating electrical grid, the alternating grid comprising a phase connected to an electric phase conductor, a neutral connected to an electric neutral conductor, and a ground connected to an electric ground connection, the system including a device for estimating the impedance of the ground connection according to claim 1.

6. The system according to claim 5, further comprising a cutoff member connected to the phase conductor and to the neutral conductor between the estimating device and the electrical installation, the cutoff member being movable between an open position, in which the electrical installation is isolated from the electrical grid, and a closed position, in which the electrical installation is connected to the electrical grid by means of phase and neutral conductors, and the cutoff member is configured to be commanded in the open position when the computed impedance of the ground connection is above a threshold value.

7. The system according to claim 6, wherein the threshold value of the impedance of the ground connection is comprised between 10 ohms and 500 ohms, and in particular substantially equal to 100 ohms.

8. A method for estimating an impedance of an electric ground connection, the electric ground connection being connected to a ground of an alternating electrical grid comprising a phase connected to an electric phase conductor and a neutral connected to an electric neutral conductor, the phase conductor, the neutral conductor and the ground connection being connected to a device for estimating the impedance of the ground connection, wherein the estimating device includes:
  an electrical component having an impedance with a predetermined value, the electrical component being positioned between the phase conductor and the ground connection;
  a switch configured to electrically isolate the electrical component of the phase conductor in an open state, and to electrically connect the electrical component to the phase conductor in a closed state;
  a first sensor configured to measure a first value of a first electrical property between the phase conductor and the ground connection when the switch is in the open state, and a second value of the first electrical property when the switch is in the closed state;
  a second sensor configured to measure a first value of a second electrical property between the neutral conductor and the ground connection when the switch is in the open state, and a second value of the second electrical property when the switch is in the closed state; and
  a computation member configured to compute the impedance of the ground connection from the predetermined value of the impedance of the electrical component and values of the first and second measured electrical properties,
the method comprising the following steps:
positioning the switch in the open state;
measuring the first value of the first electrical property using the first sensor and measuring the first value of the second electrical property using the second sensor, when the switch is in the open state;
positioning the switch in the closed state;
measuring the second value of the first electrical property using the first sensor and measuring the second value of the second electrical property using the second sensor, when the switch is in the closed state; and
computing the impedance of the ground connection from the predetermined value of the impedance of the electrical component and the values of the first and second measured electrical properties.

9. The method according to claim 8, comprising commanding the opening of the phase conductor and the neutral conductor when the computed impedance of the ground connection is above a threshold value, the command being carried out using a cutoff member connected to the phase conductor and to the neutral conductor between the estimating device and an electrical installation of an electric power supply system, the cutoff member being movable between an open position, in which the electrical installation is isolated from the electrical grid, and an open position, in which the electrical installation is connected to the electrical grid by means of phase and neutral conductors, the cutoff member being commanded in the open position when the computed impedance of the ground connection is above the threshold value.

10. The method according to claim 8, comprising detecting the phase conductor from among the phase conductor and the neutral conductor, and electrically connecting the electrical component to the phase conductor.

* * * * *